(12) United States Patent
Zhu et al.

(10) Patent No.: US 10,211,336 B2
(45) Date of Patent: Feb. 19, 2019

(54) LDMOS TRANSISTOR STRUCTURES AND INTEGRATED CIRCUITS INCLUDING LDMOS TRANSISTOR STRUCTURES

(71) Applicant: Globalfoundries Singapore Pte. Ltd., Singapore (SG)

(72) Inventors: Ming Zhu, Singapore (SG); Shi Ya Phyllis Lim, Singapore (SG); Pinghui Li, Singapore (SG); Yiang Aun Nga, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/784,422

(22) Filed: Oct. 16, 2017

(65) Prior Publication Data

US 2018/0053842 A1    Feb. 22, 2018

Related U.S. Application Data

(62) Division of application No. 15/181,780, filed on Jun. 14, 2016, now Pat. No. 9,793,394.

(51) Int. Cl.
| | |
|---|---|
| *H01L 29/78* | (2006.01) |
| *H01L 29/06* | (2006.01) |
| *H01L 29/66* | (2006.01) |
| *H01L 29/10* | (2006.01) |
| *H01L 29/08* | (2006.01) |
| *H01L 29/165* | (2006.01) |

(52) U.S. Cl.
CPC ...... *H01L 29/7824* (2013.01); *H01L 29/0653* (2013.01); *H01L 29/1087* (2013.01); *H01L 29/66689* (2013.01); *H01L 29/0869* (2013.01); *H01L 29/0886* (2013.01); *H01L 29/165* (2013.01); *H01L 29/66507* (2013.01)

(58) Field of Classification Search
CPC ................. H01L 29/7824; H01L 29/41783
See application file for complete search history.

(56) References Cited

U.S. PATENT DOCUMENTS

| 8,053,344 B1 * | 11/2011 | Fung ................ H01L 21/2257 257/E21.135 |
| 9,236,472 B2 | 1/2016 | Chen et al. |
| 2015/0097238 A1 * | 4/2015 | Zhang ............. H01L 29/6659 257/347 |

* cited by examiner

*Primary Examiner* — Yu-Hsi D Sun
(74) *Attorney, Agent, or Firm* — Lorenz & Kopf, LLP

(57) ABSTRACT

LDMOS transistor structures and integrated circuits including LDMOS transistor structures are provided. An exemplary integrated circuit including an LDMOS transistor structure includes a substrate including a first region and a second region. The substrate includes a bulk layer and, in the second region, an insulator layer overlying the bulk layer and a semiconductor layer overlying the insulator layer. The integrated circuit further includes a gate structure overlying the semiconductor layer. A channel region is formed in the semiconductor layer under the gate structure. The integrated circuit also includes a well contact region on the bulk layer in the first region, a source region overlying the substrate, and a drain region overlying the substrate. A drift region is located between the drain region and the gate structure.

20 Claims, 6 Drawing Sheets

LDMOS TRANSISTOR STRUCTURES AND INTEGRATED CIRCUITS INCLUDING LDMOS TRANSISTOR STRUCTURES

CROSS-REFERENCE TO RELATED APPLICATION

This application claims priority to U.S. patent application Ser. No. 15/181,780, filed Jun. 14, 2016, which is incorporated herein by reference in its entirety.

TECHNICAL FIELD

The present disclosure generally relates to integrated circuits, and more particularly relates to laterally diffused metal-oxide-semiconductor (LDMOS) transistor structures and to integrated circuits having LDMOS transistor structures formed over semiconductor-on-insulator (SOI) substrates.

BACKGROUND

SOI technology employs a layer of semiconductor material formed over an insulating layer on a supporting bulk wafer. The structure can be formed by different well-known techniques in the art, for example, separation by implanted oxygen, bonding and etching back, and zone melting and recrystallization, among others. Typically, the structure includes a film of monocrystalline silicon (herein referred to as the upper semiconductor layer) formed on a buried layer of silicon dioxide, which in turn is formed on a monocrystalline silicon substrate.

Field effect transistors (FETs) are typically fabricated in the upper semiconductor layer of an SOI structure. In a FET device on an SOI substrate, a conductive path is established within the upper semiconductor layer between two regions of the same conductivity type, i.e. the source and drain, through a body region of the opposite conductivity type. The current flows through such body region and a "lateral drift" region, in response to an applied gate voltage which creates an inversion channel in the body region, and a drain to source voltage which regulates the current which flows therein.

Generally, transistors are fabricated by placing an undoped polycrystalline material, for example polysilicon, over a relatively thin gate oxide, and implanting the polycrystalline material and adjacent active regions with an impurity dopant material to form source and drain regions. Transistors fabricated in the upper semiconductor layer of an SOI structure have multiple advantages over the transistors fabricated on conventional bulk silicon substrates. These advantages include, among others, resistance to short-channel effect, increased current drive, higher packing density, and reduced parasitic capacitance. However, despite all these attractive properties, SOI technology still has some drawbacks, which reduce the benefits of using this technology for high-performance and high-density ultra large scale integrated circuits.

One drawback of the SOI technology is the conductivity of the top semiconductor layer and its inherent floating body effect, which has particular significance for partially-depleted (PD) or non-fully depleted SOI devices. The floating body effect in such devices occurs as a result of the buried oxide that isolates the channel region of such device and allows charge carriers to build up in the channel region. In a partially-depleted FET, charge carriers (holes in an NFET and electrons in a PFET), generated by impact ionization and drain junction leakage near the drain/body region, accumulate near the source/body region of the transistor. When sufficient carriers accumulate, they are stored in the floating body, which is formed right below the channel region, and alter the floating body potential. As a result, kinks in the current/voltage (I/V) curve occur, the threshold voltage is lowered, the dynamic data retention time is altered, and the overall electrical performance of the device may be severely degraded.

One technique for diminishing the negative effects of the charge build up has been to form FETs over a fully depleted (FD) SOI substrate. For this, the upper semiconductor layer or island must be sufficiently thin so that the entire thickness of the body region is depleted of majority carriers and both junctions are at ground. Unfortunately, thin semiconductor islands are extremely costly and difficult to manufacture, due primarily to the sensitivity to variations of semiconductor film thickness and doping profile across the wafer, as well as to the large source/drain parasitic resistance. In addition, the low threshold voltage of a conventional fully depleted (FD) SOI causes large subthreshold leakage and low subthreshold voltage.

Accordingly, it is desirable to provide an improved method for fabricating an LDMOS transistor structure over a fully-depleted SOI substrate. In addition, it is desirable to provide methods for fabricating LDMOS transistor structures with components lying in and over an SOI insulator layer and with components lying in and over bulk semiconductor material. Also, it is desirable to provide improved integrated circuits including LDMOS transistor structures. Furthermore, other desirable features and characteristics will become apparent from the subsequent detailed description and the appended claims, taken in conjunction with the accompanying drawings and the foregoing technical field and background.

BRIEF SUMMARY

LDMOS transistor structures and integrated circuits including LDMOS transistor structures are provided. An exemplary integrated circuit including an LDMOS transistor structure includes a substrate including a first region and a second region. The substrate includes a bulk layer and, in the second region, an insulator layer overlying the bulk layer and a semiconductor layer overlying the insulator layer. The integrated circuit further includes a gate structure overlying the semiconductor layer. A channel region is formed in the semiconductor layer under the gate structure. The integrated circuit also includes a well contact region on the bulk layer in the first region, a source region overlying the substrate, and a drain region overlying the substrate. A drift region is located between the drain region and the gate structure.

In another embodiment, an LDMOS transistor structure is provided and includes a substrate including a semiconductor layer overlying an insulator layer overlying a bulk layer. The LDMOS transistor structure also includes isolation regions in the substrate. The isolation regions separate a LDMOS device region from a well tap region. Further, the LDMOS transistor structure includes a gate structure overlying the semiconductor layer in the LDMOS device region. A channel region is formed in the semiconductor layer under the gate structure.

In accordance with another embodiment, an LDMOS transistor structure includes a substrate including a semiconductor layer overlying an insulator layer overlying a bulk layer. A portion of the bulk layer is not covered by the insulator layer and semiconductor layer. The LDMOS transistor structure also includes an epitaxial drift region on the portion of the bulk layer.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Embodiments of LDMOS transistor structures and integrated circuits including LDMOS transistor structures will hereinafter be described in conjunction with the following drawing figures, wherein like numerals denote like elements, and wherein.

DETAILED DESCRIPTION

Figure 1:
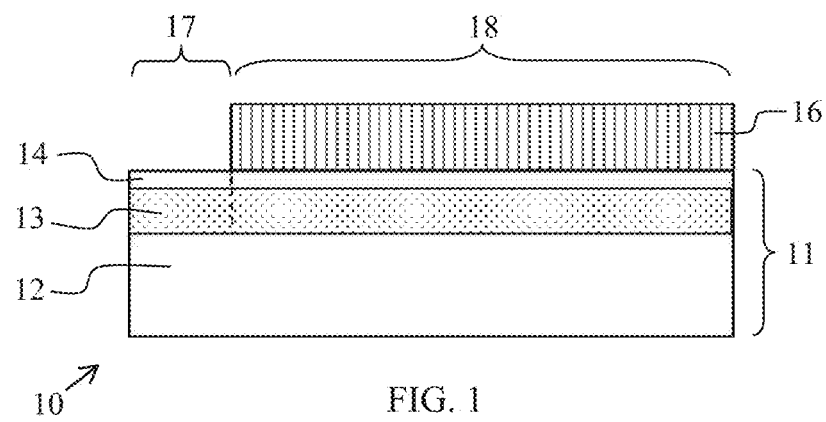
FIGS. 1-17 illustrate, in cross section, a portion of an integrated circuit and methods for fabricating the integrated circuit in accordance with various embodiments herein.

The following detailed description is merely exemplary in nature and is not intended to limit the LDMOS transistor structures and integrated circuits including LDMOS transistor structures as claimed herein. Furthermore, there is no intention to be bound by any expressed or implied theory presented in the preceding technical field, background or brief summary, or in the following detailed description.

In accordance with the various embodiments herein, LDMOS transistor structures and integrated circuits including LDMOS transistor structures are provided. Generally, the following embodiments relate to the formation of an integrated circuit over a semiconductor-on-insulator (SOI) substrate having an underlying bulk or bulk layer. Particular embodiments of an exemplary method include removing the insulator and semiconductor layers from the bulk layer in selected areas of the substrate and forming additional semiconductor material on the bulk layer. Portions of the LDMOS transistor structure and/or well contact regions may be formed over the additional semiconductor material such that those portions or regions do not lie over an insulator layer of the SOI substrate.

Embodiments provided herein provide LDMOS transistor structures over FDSOI substrates. The FDSOI substrate provides excellent gate control due to the ultra-thin body region formed by the upper semiconductor layer of the FDSOI substrate. Further, use of the FDSOI substrate allows for back-bias control through the bulk layer underlying the FDSOI insulator layer. Also, LDMOS channel region exhibits improved performance over SOI substrates as compared to bulk substrates.

In certain embodiments, both the channel region and the drift region of the LDMOS are formed in the upper semiconductor layer of the FDSOI substrate. As a result, breakdown voltage (BVdss) can be optimized by changing the length and doping concentration of the drift region. In other embodiments, the channel region is formed in the upper semiconductor layer of the FDSOI substrate while the drift region is formed over bulk semiconductor material. As a result, the drift region may be provided with a higher breakdown voltage.

FIGS. 1-17 illustrate sequentially a method for fabricating an integrated circuit having an LDMOS transistor structure in accordance with various embodiments herein. Various steps in the design and composition of integrated circuits are well known and so, in the interest of brevity, many conventional steps will only be mentioned briefly herein or will be omitted entirely without providing the well known process details. Further, it is noted that integrated circuits include a varying number of components and that single components shown in the illustrations may be representative of multiple components in the integrated circuits.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

While "MOS" originally referred to metal-oxide-semiconductor transistors, as used herein LDMOS transistors designate all types of insulated-gate field effect transistors, whether or not such transistors include metal gates, as the term "MOS" is commonly applied in the industry. For example, "MOS" transistors include those transistors utilizing silicon gate technologies that use doped polysilicon gates and silicided gates.

Turning now to FIG. 1, in an exemplary embodiment, the process of fabricating an integrated circuit 10 includes providing a substrate 11, such as a semiconductor-on-insulator (SOI) substrate. The exemplary substrate 11 includes a bulk or bulk substrate layer 12, an insulator layer 13, and a semiconductor layer 14. As shown, the insulator layer 13 isolates the semiconductor layer 14 from the bulk layer 12. An exemplary bulk layer 12 is formed from silicon or other suitable semiconductor material. An exemplary insulator layer 13 is formed from silicon oxide, commonly referred to as buried oxide (BOX), or other suitable insulator material. As used herein, an insulator material refers to a material having a resistivity greater than $1.0 \times 10^3$ Ohm-cm. An exemplary semiconductor layer 14 is silicon, or other suitable semiconductor material.

In FIG. 1, a mask 16 is formed and patterned over the substrate 11. For example, a photoresist layer may be deposited and patterned over the substrate 11 to form the mask 16. The mask 16 is patterned to expose a region 17 of the substrate 11 and to cover a region 18 of the substrate 11. As described below, a well tap or contact may be formed in the region 17 of the substrate while a LDMOS transistor structure may be formed in the region 18 of the substrate 11.

Figure 2:
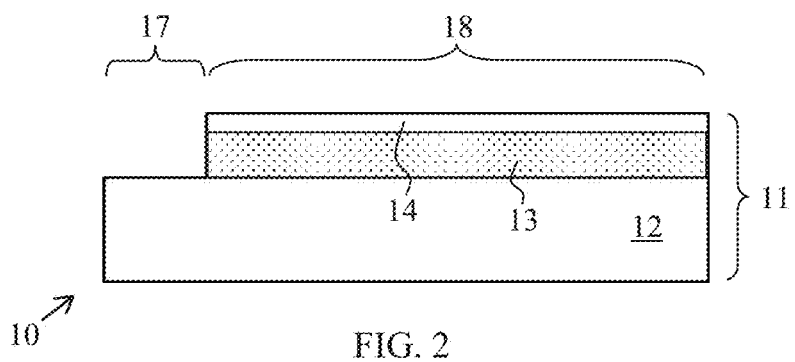

In FIG. 2, an etch process is performed to remove the semiconductor layer 14 and the insulator layer 13 in the region 17 to expose the underlying bulk layer 12. A conventional wet or dry etch may be used to selectively remove the semiconductor layer 14 and a conventional wet or dry etch may be used to selectively remove the insulator layer 13.

Figure 3:
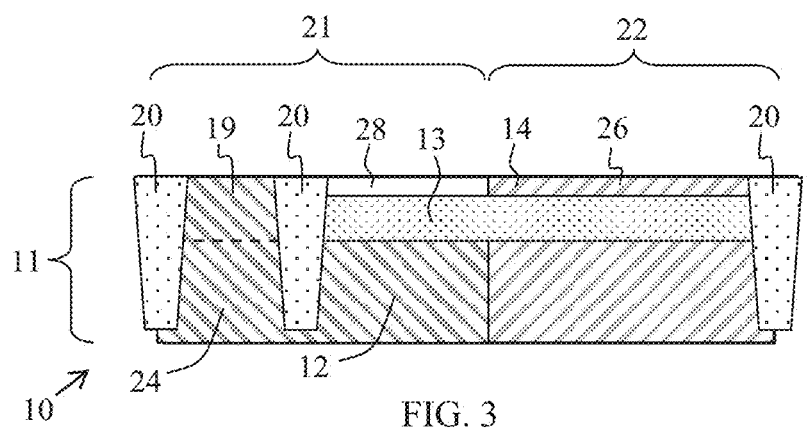

In FIG. 3, doping processes such as ion implantation processes are performed to selectively dope regions of the substrate 11. For example, a mask (not shown) may be deposited and patterned over the substrate 11 to expose a region 21 of the substrate 11 and to cover a region 22 of the substrate 11. Then, dopants may be implanted into the non-masked region 21 of the substrate 11 to form a doped well region 24. Specifically, an exposed portion of the bulk layer 12 may be doped to form the well region 24. In an exemplary embodiment, the well region 24 is doped with P dopants. The ion implantation process is performed at a depth greater than the depth of layer 14; therefore, the region 28 of layer 14 within region 21 of the substrate 11 is not doped, despite not being masked.

After forming the doped well region 24, region 21 of the substrate may be masked and region 22 of the substrate may be unmasked. Then, dopants may be implanted into the non-masked region 22 of the substrate 11 to form a doped drift region 26. Specifically, the portion of the semiconductor layer 14 in region 22 is doped to form the drift region 26. In an exemplary embodiment, the drift region 26 is lightly doped with N dopants (N⁻). The portion of the bulk layer 12 in region 22 may or may not be doped.

As shown, after doping a portion of the bulk layer 12 to form well region 24 and doping a portion of the semiconductor layer 14 to form drift region 26, a portion of the semiconductor layer 14 in region 21 remains un-doped and forms a fully depleted region 28 of undoped semiconductor material.

The method may continue in FIG. 3 with depositing semiconductor material over the well region 24 formed by bulk layer 12 to form an upper layer 19 of semiconductor material. In an exemplary embodiment, the semiconductor material forming the upper layer 19 is grown by an epitaxial process. In an exemplary embodiment, the semiconductor material forming the upper layer 19 is the same material as the bulk layer 12 and is doped to match well region 24. For example, the semiconductor material forming the upper layer 19 may be silicon doped with P dopants. In an exemplary embodiment, the upper layer 19 of semiconductor material is deposited as an in-situ P-doped silicon epitaxial material. A planarization process may be used to form the substrate 11, including the upper layer 19 and the semiconductor layer 14, with a common planar surface.

As further shown in FIG. 3, an exemplary embodiment includes forming shallow trench isolation (STI) regions 20 in the substrate 11. Such regions 20 may be formed according to conventional methods, including masking the substrate 11 and etching shallow trenches through the upper layer 19 or through the semiconductor layer 14 and the insulator layer 13, and into the bulk layer 12 underlying those layers 19 or 14 and 13. Thereafter, an insulating material may be deposited over the substrate 11 to fill the trenches. An exemplary insulating material is silicon oxide. An exemplary deposition process is chemical vapor deposition (CVD). A planarization process may remove an overburden of the insulating material to form the isolation regions 20 in the substrate 11.

Figure 4:
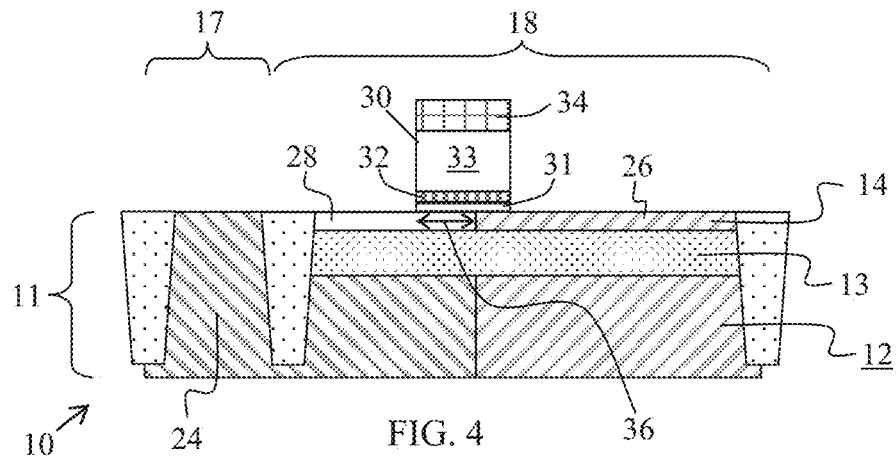
Figure 5:
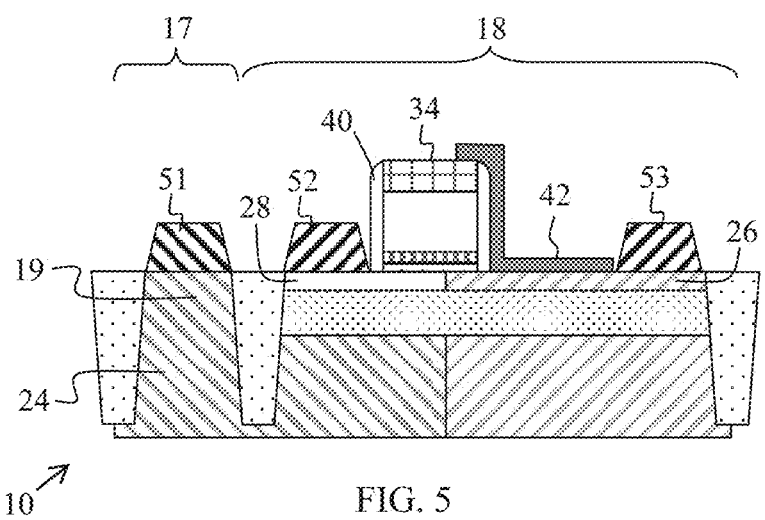
Figure 6:
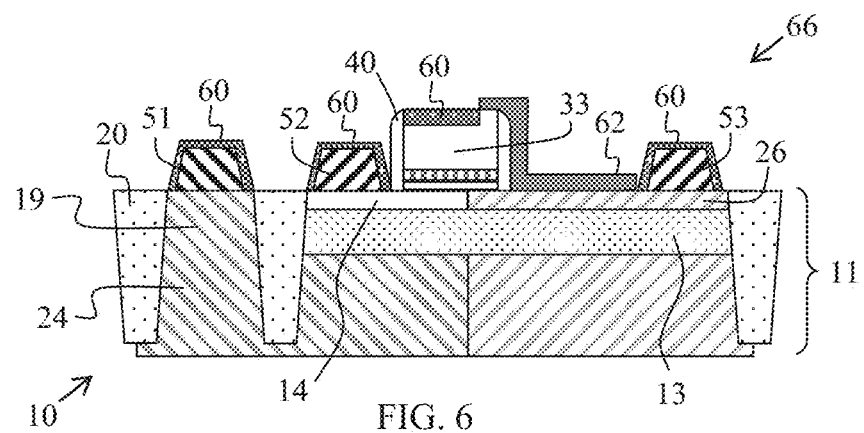

After processing of the substrate 11 to obtain the structure of FIG. 3, the method includes forming a gate structure and raised regions, such as source and drain regions. FIGS. 4-6 illustrate an embodiment in which a raised region over the drift region 26 is aligned with a mask layer. In the exemplary embodiment of FIG. 4, the method continues by forming a gate structure 30 over the substrate 11. For example, a first dielectric layer 31 may be deposited over the substrate 11. An exemplary first dielectric layer is silicon oxide. Further, second dielectric layer 32 is deposited over the first dielectric layer 31. An exemplary second dielectric layer 32 is a high k dielectric, i.e., a dielectric having a dielectric constant greater than 3.9.

Further, in an exemplary embodiment, a gate electrode layer 33 is deposited over the second dielectric layer 32. An exemplary gate electrode layer 33 is a metal or polycrystalline silicon ("polysilicon") or amorphous silicon ("a-Si"). Also, a hard mask layer 34 may be deposited over the gate electrode layer 33.

As shown, layers 31, 32, 33 and 34 are etched to form the gate structure 30. A conventional gate etch process using appropriate masking and lithography techniques may be used. The gate structure 30 is formed partially over the undoped region 28 and partially over the drift region 26. The portion of the undoped region 28 lying directly under the gate structure 30 forms a channel region having a channel length indicated by double-headed arrow 36.

The method may continue as shown in FIG. 5 with the formation of spacers 40 around the gate structure 30. For example, a spacer material may be conformally deposited and etched to form spacers 40 according to conventional techniques. Exemplary spacers 40 are formed from a suitable dielectric material such as silicon nitride or silicon oxide.

Further, the exemplary method includes forming a mask layer 42 over the gate structure 30 and a portion of the drift region 26. For example, a masking material may be blanket deposited over the substrate 11. Then the masking material may be patterned such as by conventional techniques to form the mask layer 42. In an exemplary embodiment, the masking material is silicon nitride or another suitable material.

After formation of the spacers 40 and mask layer 42, raised regions 51, 52 and 53 may be formed on exposed semiconductor regions, i.e., semiconductor surface regions not covered by the mask layer 42, spacers 40, or hard mask layer 34. For example, the raised region 51 may be formed on the surface of the upper layer 19 of the well region 24. An exemplary raised region 51 is silicon germanium (SiGe). In an exemplary embodiment, the raised region 51 is formed by epitaxial deposition. Further, in an exemplary embodiment, the raised region 51 is formed by an in situ doped epitaxial deposition process. In an exemplary embodiment, the raised region 51 is heavily P doped (P⁺). As used herein, "heavily" refers to doped layers having more than one dopant atom per one-hundred thousand atoms of semiconductor (such as silicon).

During formation of the raised region 51, the region 18 of the partially fabricated integrated circuit 10 is masked. Then, the region 18 may be unmasked and the region 17 of the partially fabricated integrated circuit 10 may be masked during formation of raised regions 52 and 53.

As shown, raised region 52 is formed on the surface of the fully depleted region 28 of the semiconductor layer 14 that is not covered by the spacer 40 or hard mask layer 34. Further, raised region 53 is formed on the surface of the drift region 26 that is not covered by the hard mask layer 34, spacer 40, or mask layer 42. In an exemplary embodiment, raised regions 52 and 53 are formed from a same material and are formed simultaneously during a same process. Alternatively, raised regions 52 and 53 may be independently formed by masking and unmasking selected portions of region 18. Exemplary raised regions 52 and 53 are silicon phosphorus (SiP). In an exemplary embodiment, the raised regions 52 and 53 are formed by epitaxial deposition. Further, in an exemplary embodiment, the raised regions 52 and 53 are formed by an in situ doped epitaxial deposition process. In an exemplary embodiment, the raised regions 52 and 53 are heavily N doped (N$^+$). After formation of the raised regions 52 and 53, the region 17 of the partially fabricated integrated circuit 10 may be unmasked.

In FIG. 6, the method may continue with formation of contacts 60 to the gate electrode layer 33 and to the raised regions 51, 52, and 53. Specifically, the hard mask layer 34, portions of the spacers 40, and the mask layer 42 are removed. Such removal may be performed by a selective etch. For example, each of the hard mask layer 34, portions of the spacers 40, and the mask layer 42 may be formed from silicon nitride, and an etch selective to silicon nitride may be performed.

To prevent contact formation on the surface of the drift region 26, a mask 62 may be formed and patterned over the partially fabricated integrated circuit 10. As shown, the mask 62 is patterned such that the surface of the drift region 26 between the raised region 53 and the spacer 40 is covered. The mask 62 may partially cover the gate electrode layer 33 to allow for variation in the mask etch process without failing to cover the desired surface of the drift region 26. An exemplary mask 62 is formed from silicon oxide or another suitable masking material.

Then, a contact formation process is performed. For example, a metal may be deposited over the partially fabricated integrated circuit and an anneal process performed to cause silicidation at the exposed surfaces of the gate electrode layer 33 and the raised regions 51, 52 and 53. An exemplary metal is nickel or another metal suitable for silicidation. As a result of silicidation, silicide contacts 60 are formed. During the anneal process, the metal remains unreacted on the surfaces of the isolation regions 20 and the mask 62. The unreacted metal may then be removed.

Figure 7:
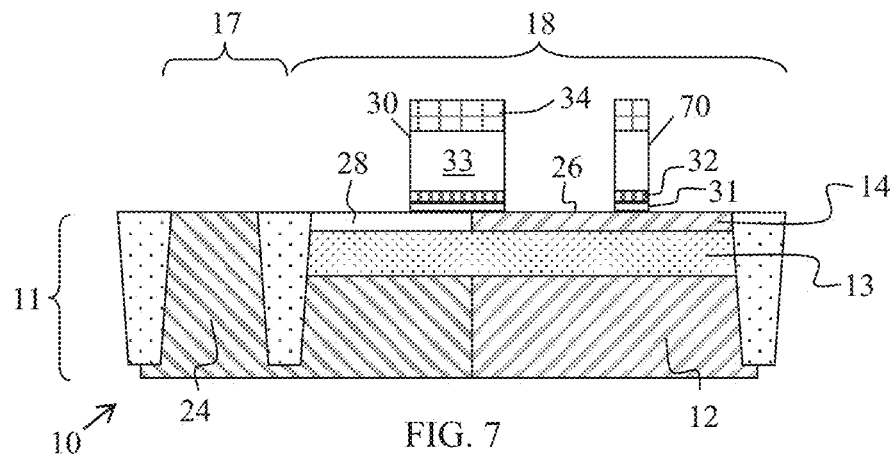
Figure 8:
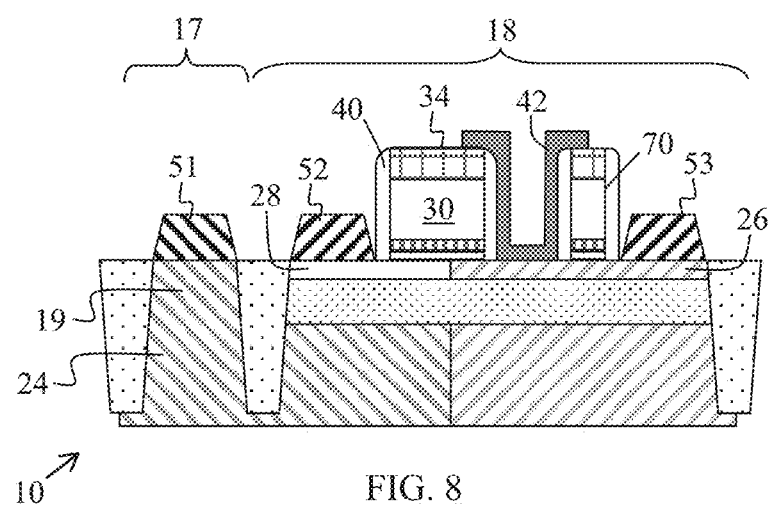

FIGS. 4-6 illustrate an embodiment in which the raised region 53 is aligned with a mask layer 42. Alternatively, the raised region 53 may be aligned with an alignment gate structure. Such a process is illustrated in FIGS. 7-8, which build from the structure illustrated in FIG. 3. As shown, an alignment gate structure 70 is formed over the drift region 26 adjacent where raised region 53 will be formed. The alignment gate structure 70 is formed for the purpose of aligning the raised region 53. In the exemplary embodiment, the alignment gate structure 70 is not electrically connected to any terminal and provides no function beyond physically limiting where the raised region 53 will be formed. In certain contexts, the alignment gate structure 70 may be considered to be sacrificial; however, in the exemplary embodiment the alignment gate structure 70 is not removed from the integrated circuit 10.

In FIG. 7, gate structure 30 and alignment gate structure 70 are formed simultaneously through common processing. For example, first dielectric layer 31 may be deposited over the substrate 11. An exemplary first dielectric layer is silicon oxide. Further, second dielectric layer 32 is deposited over the first dielectric layer 31. An exemplary second dielectric layer 32 is a high k dielectric. Further, gate electrode layer 33 is deposited over the second dielectric layer 32. An exemplary gate electrode layer 33 is a metal or polycrystalline or amorphous silicon. Also, a hard mask layer 34 may be deposited over the gate electrode layer 33.

As shown, layers 31, 32, 33 and 34 are etched to form the gate structure 30 and alignment gate structure 70. A conventional gate etch process using appropriate masking and lithography techniques may be used. As shown, the gate structure 30 and alignment gate structure 70 are separated from one another by a gap such that the alignment gate structure 70 does not affect electrical operation of the gate structure 30.

The method may continue in FIG. 8 with the formation of spacers 40 around the gate structure 30 and around the alignment gate structure 70. For example, a spacer material may be conformally deposited and etched to form spacers 40 according to conventional techniques. Exemplary spacers 40 are formed from a suitable dielectric material such as silicon nitride or silicon oxide.

Further, the exemplary method includes forming the mask layer 42 over the gate structure 30 and the alignment gate structure 70 and over the portion of the drift region 26 between the gate structure 30 and the alignment gate structure 70. For example, a masking material may be blanket deposited over the substrate 11. Then the masking material may be patterned such as by conventional techniques to form the mask layer 42. In an exemplary embodiment, the masking material is silicon nitride or another suitable material.

After formation of the spacers 40 and mask layer 42, raised regions 51, 52 and 53 may be formed on exposed semiconductor regions as described above. In the embodiment of FIG. 8, the raised region 53 is aligned with the alignment gate structure 70 rather than with the mask layer 42.

Figure 9:
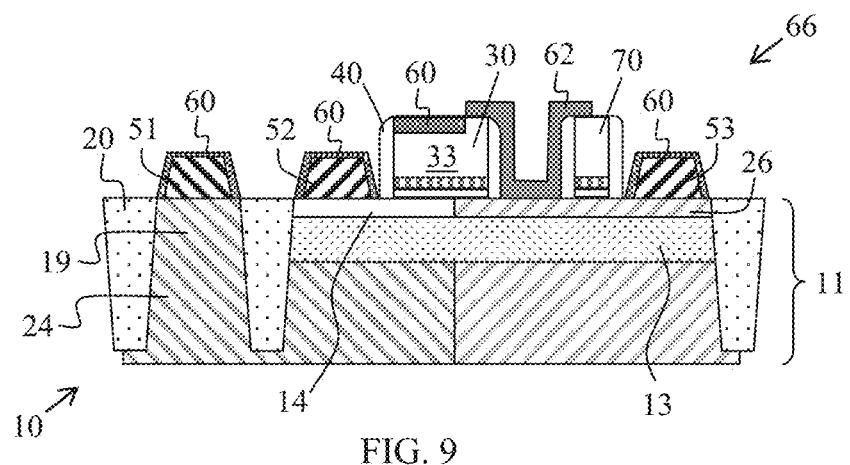

In FIG. 9, the method may continue with formation of contacts 60 to the gate electrode layer 33 and to the raised regions 51, 52, and 53 as described above. As shown, the hard mask layers 34, portions of the spacers 40, and the mask layer 42 are removed. Such removal may be performed by a selective etch.

To prevent contact formation on the surface of the drift region 26, a mask 62 may be formed and patterned over the partially fabricated integrated circuit 10. As shown, the mask 62 is patterned such that the surface of the drift region 26 between the gate structure 30 and the alignment gate structure 70 is covered. The mask 62 may partially cover the gate structure 30 and partially or completely cover alignment gate structure 70 to allow for variation in the mask etch process without failing to cover the desired surface of the drift region 26. An exemplary mask 62 is formed from silicon oxide or another suitable masking material.

Then, a contact formation process is performed. For example, a metal may be deposited over the partially fabricated integrated circuit and an anneal process performed to cause silicidation at the exposed surfaces of the gate electrode layer 33 and the raised regions 51, 52 and 53. An exemplary metal is nickel or another metal suitable for silicidation. As a result of silicidation, silicide contacts 60 are formed. During the anneal process, the metal remains unreacted on the surfaces of the isolation regions 20 and the mask 62. The unreacted metal may then be removed.

In FIG. 9, a contact is not illustrated as being formed on the alignment gate structure 70; however, a contact may be formed thereon. Alternatively, the mask 62 may completely cover the alignment gate structure 70 and prevent contact formation thereon.

Cross-referencing the embodiments of FIGS. 1-3 and 4-6 and FIGS. 1-3 and 7-9, the described methods provide an LDMOS transistor structure 66 formed over an SOI substrate 11. The LDMOS transistor structure 66 is provided with a contact 60 to a raised region 51, serving as a contact region, over a well region 24. Such a well contact 60 may be used to apply a body biasing voltage through the well region 24 to the LDMOS transistor structure 66 as desired. In the exemplary embodiment, the contact 60 to the well region 24 is not formed over the insulator layer 13. Rather, the insulator layer 13 is removed from the region 17 where the well contact 60 is formed. Further, additional semiconductor material is deposited to replace the insulator layer 13 (and the removed semiconductor layer 14) to form the upper layer 19 of the well region 24.

Also, in the exemplary embodiments, a drift region 26 is formed in the semiconductor layer 14 over the insulator layer 13 of the SOI substrate 11. Locating the drift region 26 in the semiconductor layer 14 over the insulator layer 13 allows for optimization of the breakdown voltage by changing the length and the doping concentration of the drift region 26. Raised region 53, serving as a drain region, is formed over the drift region 26.

The non-doped portion of the semiconductor layer 14 is a fully depleted region 28 that includes a channel region 36 under the gate structure 30. Providing a channel region in the semiconductor layer 14 of a FDSOI structure provides for excellent gate control. Raised region 52, serving as a source region, is formed over the fully depleted region 28.

Figure 12:
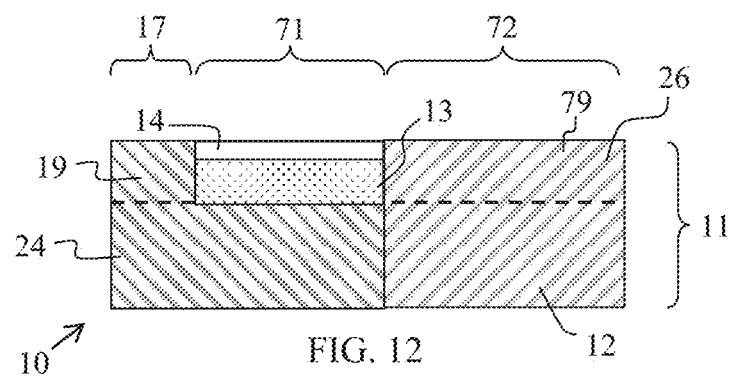
Figure 13:
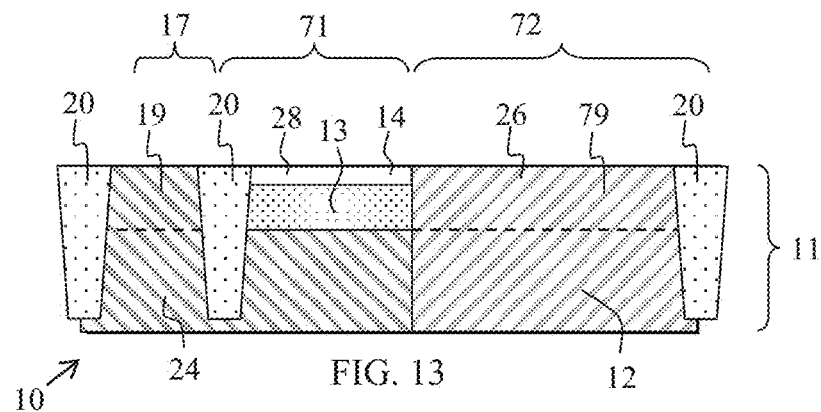
Figure 14:
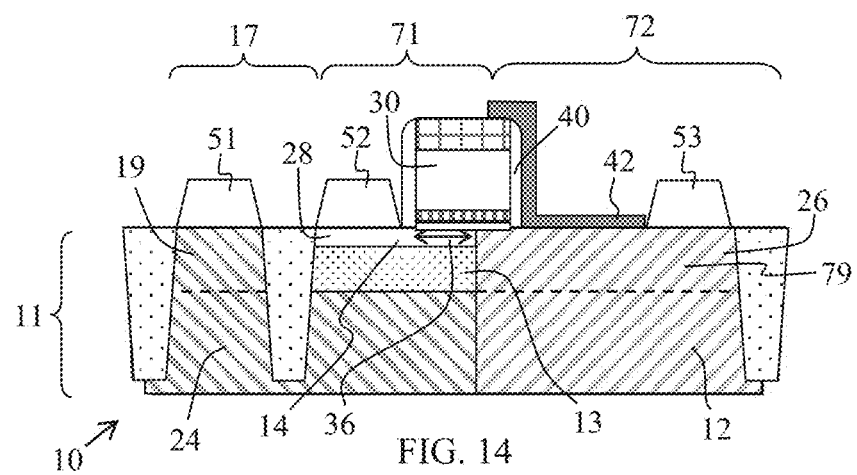
Figure 15:
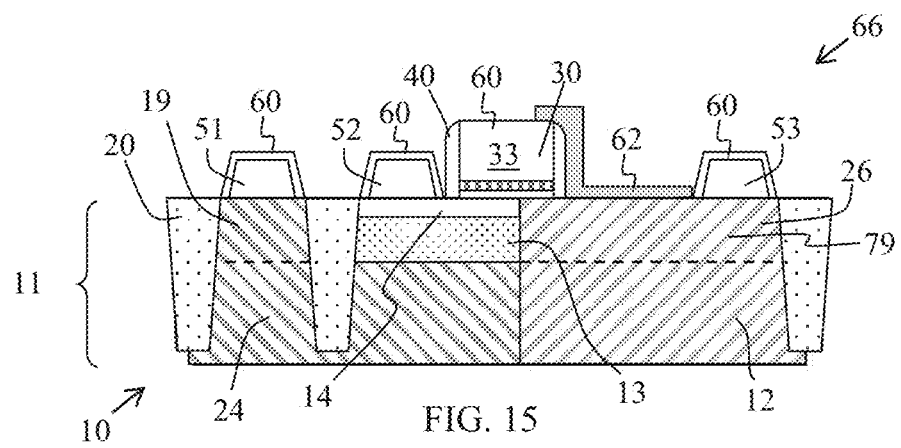
Figure 16:
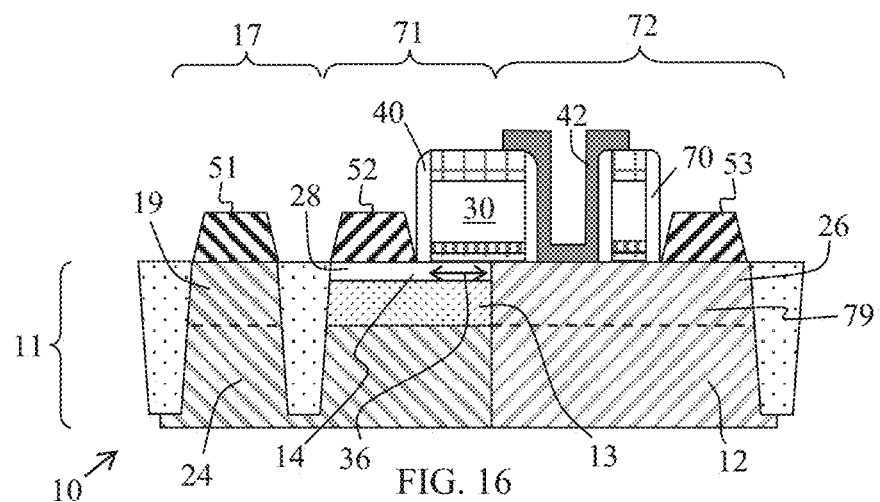
Figure 17:
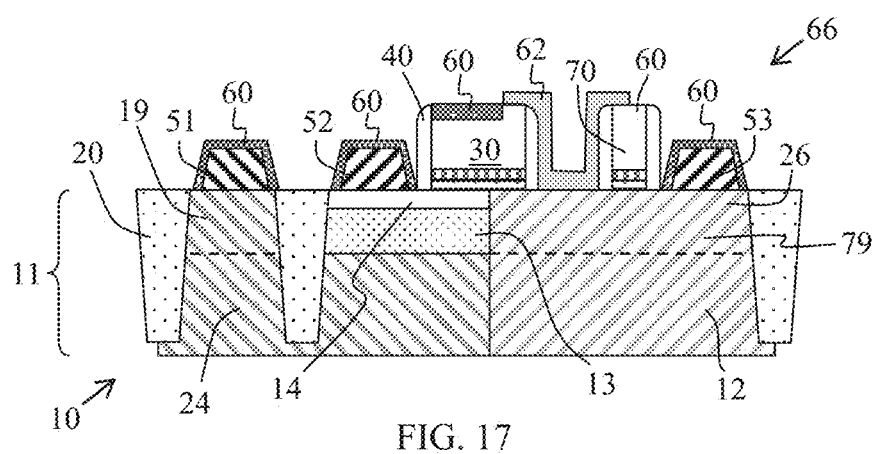

FIGS. 10-17 describe an alternate embodiment in which the drift region is formed over a bulk semiconductor material rather than in a semiconductor layer overlying an insulator layer as in a non-modified SOI substrate. FIGS. 10-13 illustrate initial processes for removing the semiconductor layer and insulator layer from the well tap region and drift region. FIGS. 14-15 illustrate gate and raised region formation, with alignment to a mask layer. FIGS. 16-17 illustrate gate and raised region formation, with alignment to an alignment gate structure.

Figure 10:
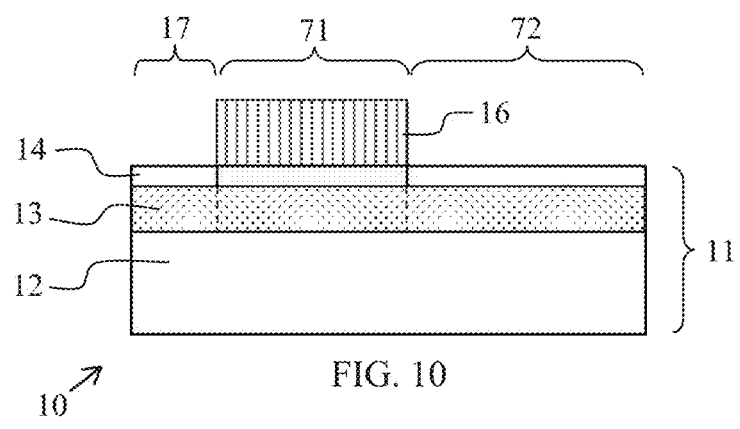

In FIG. 10, a substrate 11, such as described above, is provided. The exemplary substrate 11 includes bulk layer 12, insulator layer 13, and semiconductor layer 14. In FIG. 10, mask 16 is formed and patterned over the substrate 11. For example, a photoresist layer may be deposited and patterned over the substrate 11 to form the mask 16. The mask 16 is patterned to expose region 17 of the substrate 11, to cover region 71 of the substrate 11, and to expose region 72 of the substrate 11. As described below, a well tap or contact may be formed in the region 17 of the substrate, a source region and channel region of an LDMOS transistor structure may be formed in the region 71 of the substrate 11, and a drift region and drain region of the LDMOS transistor structure may be formed in the region 72 of the substrate 11.

Figure 11:
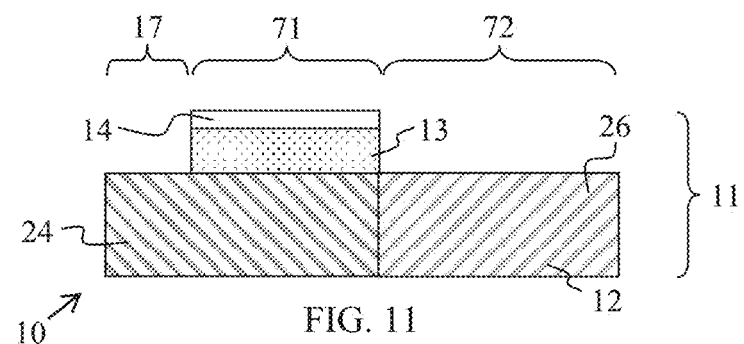

As shown in FIG. 11, an etch process is performed to remove the semiconductor layer 14 and the insulator layer 13 in region 17 and region 72 to expose the underlying bulk layer 12. Then, doping processes such as ion implantation processes are performed to selectively dope regions of the substrate 11. For example, a mask (not shown) may be deposited and patterned over the substrate 11 to expose regions 17 and 71 of the substrate 11 and to cover region 72 of the substrate 11. Then, dopants may be implanted into regions 17 and 71 of the substrate 11 not masked to form doped well region 24. Specifically, the non-masked portion of the bulk layer 12 is doped to form the well region 24. In an exemplary embodiment, the well region 24 is doped with P dopants. The ion implantation process is performed at a depth greater than the depth of layer 14; therefore, layer 14 is not doped, despite not being masked. The semiconductor layer 14 in region 71 forms a fully depleted region 28 of undoped semiconductor material.

After forming the doped well region 24, regions 17 and 71 of the substrate may be masked and region 72 of the substrate may be unmasked. Then, dopants may be implanted into the region 72 of the substrate 11 not masked to form a lower portion of a doped drift region 26. Specifically, the non-masked portion of the bulk layer 12 is doped to form a portion of drift region 26. In an exemplary embodiment, drift region 26 is lightly doped with N dopants ($N^-$).

In FIG. 12, a semiconductor material is deposited over the bulk layer 12 in regions 17 and 72 to form upper layer 19 and upper layer 79 of semiconductor material. In an exemplary embodiment, the semiconductor material forming the upper layers 19 and 79 is grown by epitaxial processes. In an exemplary embodiment, the semiconductor material forming the upper layer 19 is the same material as the bulk layer 12 and is doped to match well region 24. For example, the semiconductor material forming the upper layer 19 may be silicon doped with P dopants. In an exemplary embodiment, the upper layer 19 of semiconductor material is deposited as an in-situ P doped silicon epitaxial material. In an exemplary embodiment, the semiconductor material forming the upper layer 79 is the same material as the bulk layer 12 and is doped to match the lower portion of drift region 26. For example, the semiconductor material forming the upper layer 79 may be silicon lightly doped with N dopants ($N^-$). In an exemplary embodiment, the upper layer 79 of semiconductor material is deposited as an in-situ $N^-$ doped silicon epitaxial material and forms the upper portion of drift region 26. A planarization process may be used to form the substrate 11, including upper layers 19 and 79 and the semiconductor layer 14, with a common planar surface.

In FIG. 13, an exemplary embodiment includes forming shallow trench isolation (STI) regions 20 in the substrate 11. Such regions 20 may be formed according to conventional methods, including masking the substrate 11 and etching shallow trenches through upper layer 19, upper layer 79, or semiconductor layer 14 and the insulator layer 13, and into the bulk layer 12 underlying those layers 19, 79 or 14 and 13. Thereafter, an insulating material may be deposited over the substrate 11 to fill the trenches. An exemplary insulating material is silicon oxide. A planarization process may remove an overburden of the insulating material to form the isolation regions 20 in the substrate 11.

After processing of the substrate 11 to obtain the structure of FIG. 13, the method includes forming a gate structure and raised regions, such as source and drain regions. FIGS. 14-15 illustrate an embodiment in which a raised region over the drift region 26 is aligned with a mask layer. In the exemplary embodiment of FIG. 14, the method continues by forming a gate structure 30 over the substrate 11. As described above, the gate structure 30 may be formed by depositing and patterning a first dielectric layer, second dielectric layer, gate electrode layer, and hard mask layer over the substrate 11. The gate structure 30 is formed partially over the undoped region 28 and partially over the drift region 26. The portion of the undoped region 28 lying directly under the gate structure 30 forms a channel region having a channel length indicated by double-headed arrow 36.

As further shown, in the exemplary embodiment, spacers 40 are formed around the gate structure 30. For example, a spacer material may be conformally deposited and etched to form spacers 40 according to conventional techniques.

Exemplary spacers 40 are formed from a suitable dielectric material such as silicon nitride or silicon oxide.

Further, the exemplary method includes forming a mask layer 42 over the gate structure 30 and a portion of the drift region 26. For example, a masking material may be blanket deposited over the substrate 11. Then the masking material may be patterned such as by conventional techniques to form the mask layer 42. In an exemplary embodiment, the masking material is silicon nitride or another suitable material.

In the exemplary embodiment, after formation of the spacers 40 and mask layer 42, raised regions 51, 52 and 53 are formed on exposed semiconductor regions as described above in relation to FIG. 5. In FIG. 14, raised region 51 is formed on the surface of the upper layer 19 of the well region 24, raised region 52 is formed on the surface of the fully depleted region 28 of the semiconductor layer 14 that is not covered by the spacer 40 or gate structure 30, and raised region 53 is formed on the surface of the drift region 26 that is not covered by the gate structure 30, spacer 40, or mask layer 42. An exemplary raised region 51 is heavily P doped ($P^+$). During formation of the raised region 51, regions 71 and 72 of the partially fabricated integrated circuit 10 are masked. Then, regions 71 and 72 may be unmasked and region 17 of the partially fabricated integrated circuit 10 may be masked during formation of raised regions 52 and 53. Exemplary raised regions 52 and 53 are silicon phosphorus (SiP). In an exemplary embodiment, the raised regions 52 and 53 are heavily N doped ($N^+$). After formation of the raised regions 52 and 53, region 17 of the partially fabricated integrated circuit 10 may be unmasked.

In FIG. 15, the method may continue with formation of contacts 60 to the gate electrode layer 33 and to the raised regions 51, 52, and 53. Specifically, the gate structure hard mask layer, portions of the spacers 40, and the mask layer 42 are removed. Such removal may be performed by a selective etch. For example, each of the gate structure hard mask layer, spacers 40, and mask layer 42 may be formed from silicon nitride, and an etch selective to silicon nitride may be performed.

To prevent contact formation on the surface of the drift region 26, a mask 62 may be formed and patterned over the partially fabricated integrated circuit 10. As shown, the mask 62 is patterned such that the surface of the drift region 26 between the raised region 53 and the spacer 40 is covered. The mask 62 may partially cover the gate electrode layer 33 to allow for variation in the mask etch process without failing to cover the desired surface of the drift region 26. An exemplary mask 62 is formed from silicon oxide or another suitable masking material.

As shown, a contact formation process is performed. For example, a metal may be deposited over the partially fabricated integrated circuit and an anneal process performed to cause silicidation at the exposed surfaces of the gate electrode layer 33 and the raised regions 51, 52 and 53. An exemplary metal is nickel or another metal suitable for silicidation. As a result of silicidation, silicide contacts 60 are formed. During the anneal process, the metal remains unreacted on the surfaces of the isolation regions 20 and the mask 62. The unreacted metal may then be removed.

FIGS. 14-15 illustrate an embodiment in which the raised region 53 is aligned with a mask layer 42. Alternatively, the raised region 53 may be aligned with an alignment gate structure. Such a process is illustrated in FIGS. 16-17, which build from the structure illustrated in FIG. 13. As shown, an alignment gate structure 70 is formed over the drift region 26 adjacent where raised region 53 will be formed. The alignment gate structure 70 is formed for the purpose of aligning the raised region 53. In the exemplary embodiment, the alignment gate structure 70 is not electrically connected to any terminal.

In FIG. 16, gate structure 30 and alignment gate structure 70 are formed simultaneously as described above through common processing. For example, first dielectric layer, second dielectric layer, gate electrode layer, and hard mask layer may be deposited and patterned over the substrate 11. As shown, the gate structure 30 and alignment gate structure 70 are separated from one another by a gap such that the alignment gate structure 70 does not affect electrical operation of the gate structure 30.

As shown, spacers 40 are formed around the gate structure 30 and around the alignment gate structure 70 as described above. Further, a mask layer 42 may be formed over the gate structure 30 and the alignment gate structure 70 and over the portion of the drift region 26 between the gate structure 30 and the alignment gate structure 70 as described above.

After formation of the spacers 40 and mask layer 42, raised regions 51, 52 and 53 may be formed on exposed semiconductor regions as described above. In the embodiment of FIG. 16, the raised region 53 is aligned with the alignment gate structure 70. For an embodiment in which the gate electrode layer of gate structure 30 is polycrystalline silicon, variation in the deposition and patterning of the gate electrode layer is less than the variation in the deposition and patterning of the mask layer 42. Thus, the raised region 53 may be more precisely located and aligned in the embodiment of FIG. 8, as compared to the embodiment of FIG. 5 in which the raised region 53 is aligned with the mask layer 42.

In FIG. 17, the method may continue with formation of contacts 60 to the gate structure 30 and to the raised regions 51, 52, and 53 as described above. As shown, the gate structure hard mask layers, portions of the spacers 40, and the mask layer 42 are removed. Such removal may be performed by a selective etch.

To prevent contact formation on the surface of the drift region 26, a mask 62 may be formed and patterned over the partially fabricated integrated circuit 10. As shown, the mask 62 is patterned such that the surface of the drift region 26 between the gate structure 30 and the alignment gate structure 70 is covered.

The mask 62 may partially cover the gate structure 30 and partially or completely cover alignment gate structure 70 to allow for variation in the mask etch process without failing to cover the desired surface of the drift region 26. An exemplary mask 62 is formed from silicon oxide or another suitable masking material.

Then, a contact formation process is performed. For example, a metal may be deposited over the partially fabricated integrated circuit and an anneal process performed to cause silicidation at the exposed surfaces of the gate electrode layer 33 and the raised regions 51, 52 and 53. An exemplary metal is nickel or another metal suitable for silicidation. As a result of silicidation, silicide contacts 60 are formed. During the anneal process, the metal remains unreacted on the surfaces of the isolation regions 20 and the mask 62. The unreacted metal may then be removed.

In FIG. 17, a contact is shown as being formed on the alignment gate structure 70; however, a contact need not be formed thereon. For example, the mask 62 may completely cover the alignment gate structure 70 and prevent contact formation thereon.

Cross-referencing the embodiments of FIGS. 10-13 and 14-15 and FIGS. 10-13 and 16-17, the described methods provide an LDMOS transistor structure 66 formed over an SOI substrate 11 and including a drift region 26 formed in bulk material of upper layer 79 and bulk layer 12 of the substrate 11.

As described, the insulator layer 13 is removed from region 72. Further, additional semiconductor material is deposited to replace the insulator layer 13 (and the removed semiconductor layer 14) to form the upper layer 79. The drift region 26 is formed in the upper layer 79 and bulk layer 12 in region 72. Locating the drift region 26 in a bulk material provides for a higher breakdown voltage. Raised region 53, serving as a drain region, is formed over the drift region 26.

Likewise, raised region 51, serving as a contact region, and contact 60 to the well region 24 are not formed over the insulator layer 13. Rather, the insulator layer 13 is removed from the region 17 where the well contact 60 is formed. Further, additional semiconductor material is deposited to replace the insulator layer 13 (and the removed semiconductor layer 14) to form the upper layer 19 of the well region 24. The contact 60 to the raised region 51 over the well region 24 may be used to apply a body biasing voltage through the well region 24 to the LDMOS transistor structure 66 as desired.

The remaining semiconductor layer 14 is non-doped and serves as a fully depleted region 28 that includes a channel region 36 under the gate structure 30. Providing a channel region in the semiconductor layer 14 of a FDSOI structure provides for excellent gate control. Raised region 52, serving as a source region, is formed over the fully depleted region 28.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit including an LDMOS transistor structure comprising:
a substrate including a first region and a second region, wherein the substrate includes a bulk layer and, in the second region, an insulator layer overlying the bulk layer and a semiconductor layer overlying the insulator layer;
a gate structure overlying the semiconductor layer, wherein a channel region is formed in the semiconductor layer under the gate structure;
a well contact region on the bulk layer in the first region, wherein the insulator layer is not located between the well contact region and the bulk layer;
a source region overlying the substrate; and
a drain region overlying the substrate, wherein a drift region is located between the drain region and the gate structure.

2. The integrated circuit of claim 1 wherein the drain region is formed in the semiconductor layer overlying the insulator layer.

3. The integrated circuit of claim 1 wherein the substrate includes a third region, wherein the drift region is located on the bulk layer in the third region, and wherein the drain region is located on the drift region.

4. The integrated circuit of claim 1 further comprising a well region in contact with the well contact region in the first region and with the insulator layer in the second region.

5. The integrated circuit of claim 1 further comprising an alignment gate overlying the drift region in the substrate.

6. The integrated circuit of claim 5 wherein the drain region is self-aligned with the alignment gate.

7. The integrated circuit of claim 6 wherein the drift region is located between the drain region and the gate structure.

8. The integrated circuit of claim 6 further comprising contacts to the gate structure and the drain region.

9. The integrated circuit of claim 1 further comprising contacts to the gate structure, the source region, and the drain region.

10. The integrated circuit of claim 1 further comprising:
isolation regions in the substrate, wherein the isolation regions separate a LDMOS device region from the well contact region; and
a contact to the bulk layer in the well contact well tap region.

11. The integrated circuit of claim 1 further comprising:
isolation regions in the substrate, wherein the isolation regions separate a LDMOS device region from the well contact region;
an epitaxial contact region over the bulk layer in the well contact region, wherein the drain region is an epitaxial drain region; and
contacts to the epitaxial contact region, the epitaxial drain region and the gate structure.

12. The integrated circuit of claim 1 further comprising an epitaxial contact region directly on a portion of the bulk layer.

13. An LDMOS transistor structure comprising:
a substrate including a semiconductor layer overlying an insulator layer overlying a bulk layer, wherein the insulator layer is located at a first depth;
isolation regions in the substrate, wherein the isolation regions separate a LDMOS device region from a well tap region, and wherein the isolation regions extend from the semiconductor layer and past the insulator layer to a second depth deeper than the first depth;
a gate structure overlying the semiconductor layer in the LDMOS device region, wherein a channel region is formed in the semiconductor layer under the gate structure.

14. The LDMOS transistor structure of claim 13 further comprising contacts to the bulk layer in the well tap region and to the gate structure.

15. The LDMOS transistor structure of claim 13 further comprising:
an epitaxial contact region over the bulk layer in the well tap region;
an epitaxial drain region; and
contacts to the epitaxial contact region and to the gate structure.

16. The LDMOS transistor structure of claim 13 further comprising:
a source region overlying the substrate; and
a drain region overlying the substrate, wherein a drift region is located between the drain region and the gate structure;
contacts to the bulk layer in the well tap region, to the gate structure, to the source region, and to the drain region.

17. An LDMOS transistor structure comprising:
a substrate including a semiconductor layer overlying an insulator layer overlying a bulk layer, wherein a portion of the bulk layer is not covered by the insulator layer and semiconductor layer; and
an epitaxial contact region directly on the portion of the bulk layer.

18. The LDMOS transistor structure of claim 17 further comprising:
a gate structure overlying the substrate, wherein a channel region is formed in the semiconductor layer under the gate structure;
a drain region on the epitaxial drift region, wherein the epitaxial drift region is located between the drain region and the gate structure; and
a source region overlying the substrate.

19. The LDMOS transistor structure of claim 18 further comprising contacts to the gate structure, the source region, and the drain region.

20. The LDMOS transistor structure of claim 17 further comprising an isolation region extending from the semiconductor layer and past the insulator layer into the bulk layer, wherein the isolation region isolates the portion of the bulk layer not covered by the insulator layer and semiconductor layer from the insulator layer and semiconductor layer.

* * * * *